(12) United States Patent
Knoll et al.

(10) Patent No.: US 7,205,188 B2
(45) Date of Patent: Apr. 17, 2007

(54) METHOD FOR PRODUCING HIGH-SPEED VERTICAL NPN BIPOLAR TRANSISTORS AND COMPLEMENTARY MOS TRANSISTORS ON A CHIP

(75) Inventors: Dieter Knoll, Frankfurt an der Oder (DE); Bernd Heinemann, Frankfurt an der Oder (DE)

(73) Assignee: IHP GmbH-Innovations for High Performance Microelectronics/Institute for Innovative Mikroele, Frankfurt an der Oder (DE)

( * ) Notice: Subject to any disclaimer, the term of this patent is extended or adjusted under 35 U.S.C. 154(b) by 0 days.

(21) Appl. No.: 10/450,006

(22) PCT Filed: Dec. 6, 2001

(86) PCT No.: PCT/EP01/14319

§ 371 (c)(1),
(2), (4) Date: Nov. 20, 2003

(87) PCT Pub. No.: WO02/47160

PCT Pub. Date: Jun. 13, 2002

(65) Prior Publication Data
US 2004/0209418 A1    Oct. 21, 2004

(30) Foreign Application Priority Data
Dec. 8, 2000  (DE) ................ 100 61 199

(51) Int. Cl.
*H01L 21/8238*  (2006.01)
(52) U.S. Cl. ..................... 438/202; 438/235

(58) Field of Classification Search ........... 438/202, 438/234, 235, 312, 314
See application file for complete search history.

(56) References Cited

U.S. PATENT DOCUMENTS

| | | | |
|---|---|---|---|
| 5,759,883 A | 6/1998 | Kinoshita | 438/202 |
| 5,972,766 A * | 10/1999 | Kishi | 438/202 |
| 6,066,521 A | 5/2000 | Yokoyama et al. | 438/202 |
| 6,281,065 B1 * | 8/2001 | Ushiroda | 438/202 |

FOREIGN PATENT DOCUMENTS

DE            209055         4/1984

(Continued)

OTHER PUBLICATIONS

Osten, H.J. et al: "Carbon doped SiGe heterojunction bipoplar transistor module suitable for integration in a deep submicron CMOS process", 2000 Asia-Pacific Microwave Conference. Proceedings (Cat. No. 00TH8522), Proceedings of 2000 Asis-Pacific Microwave Conference, Sydney, NSW, Australia, Dec. 3-6, 2000, pp. 757-762 (XP001077743).

(Continued)

*Primary Examiner*—Chandra Chaudhari (57) ABSTRACT

The invention relates to a method for producing high-speed vertical npn bipolar transistors and complementary MOS transistors on a chip. In order to produce these high-speed vertical npn bipolar transistors and complementary MOS transistors on a chip, all technological method steps for producing the vertical structure of the collector, base and emitter in the active region of the npn bipolar transistors as well as for laterally structuring the collector regions, base regions and emitter regions are performed before the troughs and the gate insulating layer for the MOS transistors are produced.

12 Claims, 6 Drawing Sheets

FOREIGN PATENT DOCUMENTS

DE    19842106    3/2000
JP    10178117    6/1998

OTHER PUBLICATIONS

Patent Abstracts of Japan, vol. 1998, No. 11, Sep. 30, 1998 regarding JP 10178117 A (SONY Corp.), Jun. 30, 1998 Method of Manufacturing Semiconductor Device.

Ehwald, K.E. et al: "Modular integration of high-performance SiGe: C HBTs in a deep submicron, epi-free CMOS process", Electron Devices Meeting, 1999. IEDM Technical Digest. International Washington, DC, USA Dec. 5-8, 1999, Piscataway, NJ, USA, IEEE US, Dec. 5, 1999, pp. 561-564 (XP010372172).

St Onge, S.A. et al: "A 0.24 /spl mu/m SiGe BiCMOS mixed-signal RF production technology featuring a 47 Ghz ft HBT and 0.18 /spl mu/m Lett CMOS", Bipolar/MiCMOS Circuits and Technology Meeting, 1999. Proceedings of The 1999 Minneapolis, MN, USA Sep. 26-28, 1999, Piscataway, NJ, USA, IEEE, US, Sep. 26, 1999, pp. 117-120 (XP010359517).

Dunn, J. et al: "Trends in silicon germanium BiCMOS integration and reliability", 2000 IEEE International Reliability Physics Symposium Proceedings, 38th Annual (Cat. No.00CH37059), 2000 IEEE International Reliability Physics Symposium Proceedings, 38th Annual, San Jose, CA, USA, Apr. 10-13, 2000, pp. 237-242 (XP001077899) 2000, Piscataway, NJ, USA, IEEE, USA.

Knoll, D. et al: "HBT before CMOS, a new modular SiGe BiCMOS integration scheme", International Electron Devices Meeting. Technical Digest (Cat. No. 01CH37224), International Electron Devices Meeting, Technical Digest Washington, DC, USA, DEC. 2-5, 2001, pp.22.2.1-4 (XP001074775) 2001, Piscataway, NJ, USA, IEEE, USA.

Muhlberger, M. et al: "Carbon Co-Doping of Si1-xGex:B Layers: Suppression of Transient Enhanced Diffusion", Proc. Current Developments of Microelectronics, Bad Hofgastein, Mar. 1999, pp. 167-170.

Ahlgren, D. et al: "SiGe Fuels HIgh-Speed Communications", Semiconductor International, Nov. 2000, (online, retrieved on Apr. 10, 2001) (Internet <URL:http//www.semiconductor.net/semiconductor/issues/issues/2000/200011).

Freeman, G. et al: "A 0.18um 90 GHz ft SiGe HBT BiCMOS, ASIC-Compatible, Copper Interconnect Technology for RF and Microwave Applications", IDEM 99, 1999, pp. 569-572.

Knoll, D. et al: "Modular High-Performance BiCMOS by Integration of SiGe:C HBTs", Extended Abstract, 199th ECS Meeting, Washington, DC Mar. 25-30, 2001.

\* cited by examiner

METHOD FOR PRODUCING HIGH-SPEED VERTICAL NPN BIPOLAR TRANSISTORS AND COMPLEMENTARY MOS TRANSISTORS ON A CHIP

BACKGROUND OF THE INVENTION

1. Field of Invention

The invention concerns a process for the production of high-speed vertical npn-bipolar transistors and complementary MOS-transistors on a chip.

2. Description of Related Art

BiCMOS-technologies are used for the production of integrated circuits or circuit blocks which include both MOS-transistors with a p- and an n-channel and also bipolar transistors. Modern BiCMOS-technologies aim specifically at combining circuit blocks with very high-speed bipolar transistors and very highly integrated CMOS logic on a chip in order to achieve powerful technological platforms for wireless and optical waveguide-based telecommunications. In consideration of the immense expenditure in terms of development and qualification of a very highly integrated CMOS technology, the modular integration of bipolar transistors into a qualified CMOS-technology is the most economical way of implementing such a modern BiCMOS-technology. Modular integration denotes in that respect that the influence of the additional process steps which are required for manufacture of the bipolar transistors on the parameters and yield of the CMOS transistors is kept so low that the circuitry libraries of the CMOS-technology can also be used for the BiCMOS-technology which is derived therefrom.

The best high-frequency characteristics of Si-based bipolar transistors are achieved at the present time with SiGe-hetero-bipolar transistors (SiGe-HBT). For that reason SiGe-HBT are also used for high-power BiCMOS-technologies, as described for example in G. Freeman: 'A 0.18 μm 90 GHz $f_T$ SiGe HBT BiCMOS, ASIC-Compatible, Copper Interconnect Technology for RF and Microwave Applications' Technical Digest of the 1999 International Electron Devices Meeting, pages 569–572 and R. Tang et al.: 'A Low-Cost Modular SiGe BiCMOS Technology and Analog Passives for High-Performance RF and Wide-Band Applications' Proceedings of the 2000 Bipolar/BiCMOS Circuits and Technology Meeting, pages 102–105. It is characteristic in respect of those technologies that essential process steps for integration of the HBTs into the original CMOS-process and for production of the HBTs themselves, such as the deposit of various protective layers, the SiGe-base layer and the emitter layer, are effected after production of the CMOS-wells, gate oxidation, gate structuring and (in the first publication quoted) doping and restoration of the MOS-transistors with an n-channel. That specific procedure for the production of bipolar transistors within a BiCMOS-technology has the disadvantage that it is not possible to completely exclude influencing of the vertical and lateral doping profiles of the CMOS-transistors by HBT-process steps, in particular by virtue of the given thermal budget thereof. The consequence of this can be that the original CMOS-transistor parameters cannot be exactly reproduced in the BiCMOS-process.

Theoretically that disadvantage can be avoided if all technological process steps which are employed for integration and production of the bipolar transistors were effected prior to the production of the wells and the gate insulating layer for the MOS-transistors. It will be noted that with that operating procedure the CMOS-process steps then act on the bipolar structures, which causes extreme difficulty in implementation of the steep doping profiles necessary for very good high-frequency properties, in particular in the base of the bipolar transistors. That applies in particular in regard to SiGe-HBTs, where a widening of the base doping profile (boron) beyond the edges of the SiGe-layer results in the formation of parasitic conduction band barriers which make it impossible to achieve very good high-frequency properties. CMOS-process steps which are particularly critical in terms of their effect on the doping profiles of bipolar transistors are gate oxidation and, when employed, reoxidation of the polysilicon gates, both just by virtue of the thermal budget which is usually involved in that respect. When those steps have an effect on unprotected single-crystal regions of the bipolar structures, the so-called OED effect is additionally involved (OED—Oxidation Enhanced Diffusion). A further critical CMOS-process step is restoration of the implant which is used for doping of the gate and source-drain regions of the MOS-transistors with an n-channel.

SUMMARY OF THE INVENTION

Particularly when using arsenic as the doping element, in order to avoid gate depletion, it is necessary to usually involve a thermal budget which can greatly widen the base doping profile of bipolar transistors and in the case of SiGe-HBTs displace it beyond the edges of the SiGe-layer.

Therefore the object of the invention is to eliminate the described disadvantages of the state of the art and to propose a process for the production of high-speed vertical npn-bipolar transistors and complementary MOS-transistors on a chip, and in addition to avoid any influencing of the vertical and lateral doping profiles of the CMOS-transistors by the process steps which are used for production of the bipolar transistors.

In accordance with the invention that object is attained in that all technological process steps for the production of the vertical structure of collector, base and emitter in the active region of the npn-bipolar transistors and for lateral structuring of the collector, base and emitter regions are effected prior to production of the wells and the gate insulating layer for the MOS-transistors. The technological process steps for production of the vertical structure of collector, base and emitter in the active region of the npn-bipolar transistors and for lateral structuring of the collector, base and emitter regions are carried out prior to production of the wells and/or the gate insulating layer for the MOS-transistors. The finished structures of the npn-bipolar transistors, prior to the production of the gate insulating layer for the MOS-transistors, are provided with a protective layer which, during execution of technological process steps for production of the MOS-transistors, prevents conversion of silicon into silicon oxide within the finished structures of the npn-bipolar transistors. A relief is rounded between the structured emitter and base regions of the npn-bipolar transistors prior to production of the gate insulating layer for the MOS-transistors, to such an extent that the formation of spacers is avoided at that relief during structuring of the gates of the MOS-transistors. Not more than 4 lithographic steps are used for the provision of the vertical structure of collector, base and emitter in the active region of the npn-bipolar transistors and the lateral structuring of the collector, base and emitter regions. The doping profile for the base of the bipolar structures in the vertical direction is enclosed with a C-atom profile which has a concentration in the range of between $1 \times 10^{19}$ and $1 \times 10^{20}$ cm$^{-3}$. In spite of the action of the CMOS process steps on the bipolar structures the bipolar structures produced using BiCMOS-technology have a vertical doping profile, the process according to the invention makes it possible to achieve a product of collector-emitter breakdown voltage ($BV_{CEO}$) and transit frequency ($f_T$) of at least 150 VGHz. The production according to the invention of single-polysilicon npn SiGe-HBTs in a BiCMOS-technology is set forth hereinafter by reference to an example illustrated by FIGS. 1(a) through 1(p).

The operating procedure set forth in that respect can equally well be applied to double-polysilicon npn SiGe-HBTs and to npn Si-homo-bipolar transistors, the base of which is produced by implantation or epitaxy.

DETAILED DESCRIPTION OF THE INVENTION

Figure 1A:
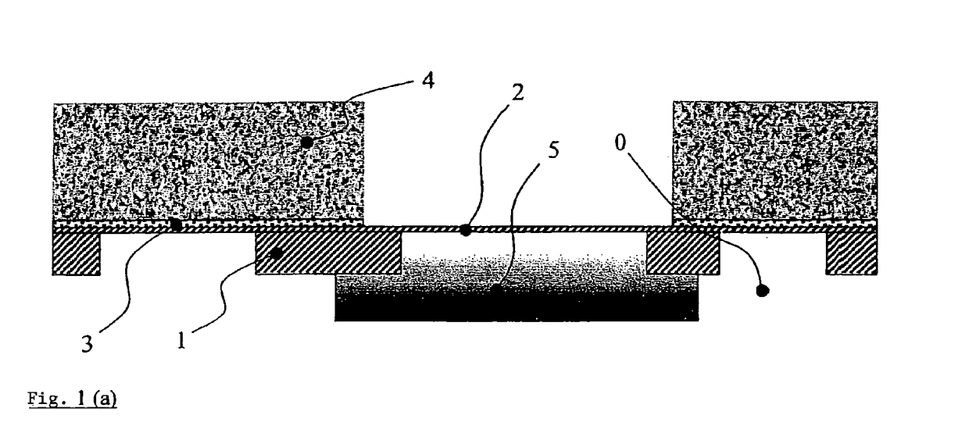
FIG. 1(a) is a diagram of a semiconductor structure in accordance with a respective step in the process of the present invention.

FIG. 1(a) shows the initial structure. Insulating regions 1 comprising $SiO_2$ were introduced into an Si wafer 0 with methods which are usual in semiconductor technology. The wafer is covered over its entire area with a further $SiO_2$ layer 2 and a layer 3 comprising $Si_3N_4$. A first mask of photolacquer 4 was produced using the methods usual in semiconductor technology. The nitride layer was preferably dry-chemically etched out in the regions freed of photolacquer and then an n-conductive region 5 produced by implantation with ions. The damage produced in that implantation operation was restored after removal of the lacquer mask and suitable cleaning preferably by means of an RTA-step (RTA=Rapid Thermal Annealing). The subjacent $SiO_2$ layer is then removed by means of a suitable hydrofluoric acid-bearing solution, in which respect the previously structured nitride layer serves as a mask.

Figure 1B:
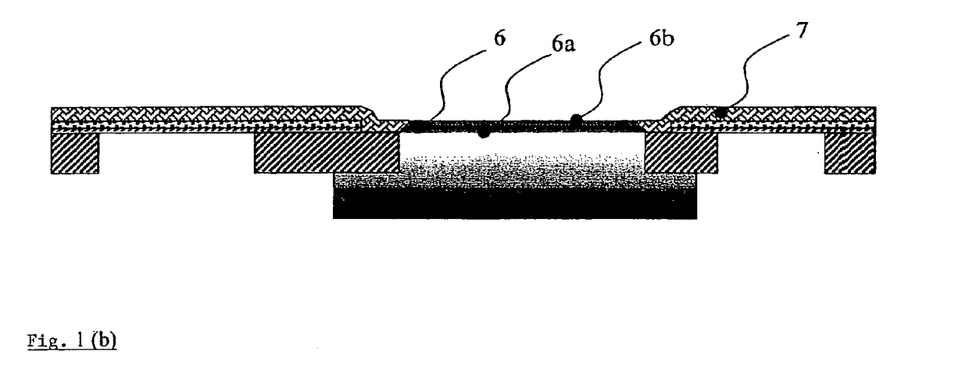
FIG. 1(b) is a diagram of a semiconductor structure in accordance with a respective step in the process of the present invention.

After the application of suitable cleaning procedures, production of a single-crystal layer stack is effected, comprising an Si-buffer layer 6a, the SiGe-base layer 6 doped with boron atoms and the Si-cover layer 6b (FIG. 1(b)). A suitable configuration for the deposition process provides that, during the epitaxial growth of the layers 6a and 6b, a polycrystalline Si/SiGe/Si-layer 7 is produced at the same time on the regions covered with $SiO_2$ or $Si_3N_4$. What is essential for manufacture in accordance with the invention of the SiGe-HBTs is that in the SiGe-layer deposition process the doping profile for the base of the bipolar structures, in the vertical direction, is enclosed by a C-atom profile which has a concentration in the range of between $1 \times 10^{19}$ and $1 \times 10^{20}$ cm$^{-3}$. That measure ensures that the thermal budget which is later applied for formation of the CMOS-structures does not result in a widening of the base doping profile beyond the edges of the SiGe-layer and thus the formation of parasitic conduction band barriers which would make it impossible to achieve the desired high-frequency properties.

Figure 1C:
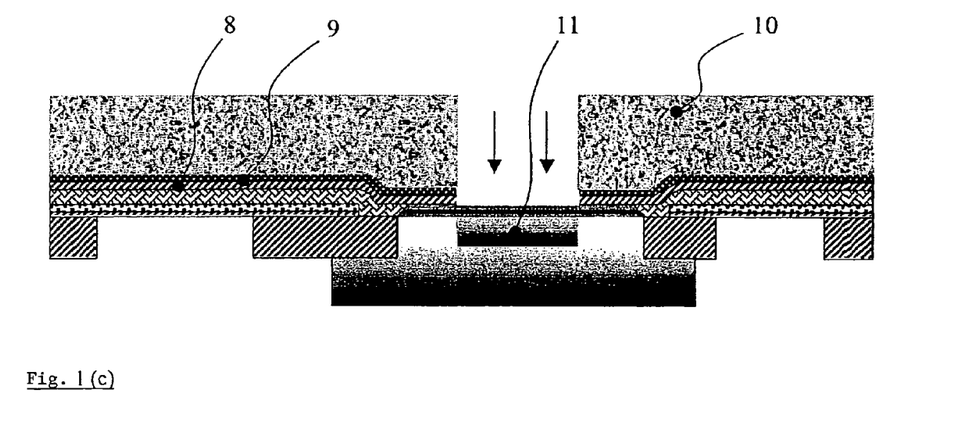
FIG. 1(c) is a diagram of a semiconductor structure in accordance with a respective step in the process of the present invention.

FIG. 1(c) shows the production of the emitter windows of the HBTs with the photolacquer mask 10. That mask is used in order preferably by means of dry-chemical etching in the lacquer-free regions to remove a layer 9 consisting of amorphous or polycrystalline Si and a part of the $SiO_2$-layer 8 and to locally produce an n-conducting region 11 by means of ion implantation. After removal of the lacquer mask, the remainder of the $SiO_2$-layer 8 is removed in the etched window by means of hydrofluoric acid-bearing solution and an Si-layer 12 is deposited. That layer is doped during the deposition procedure preferably with As, an As-concentration of at least $10^{20}$ cm$^{-3}$ being set.

Figure 1D:
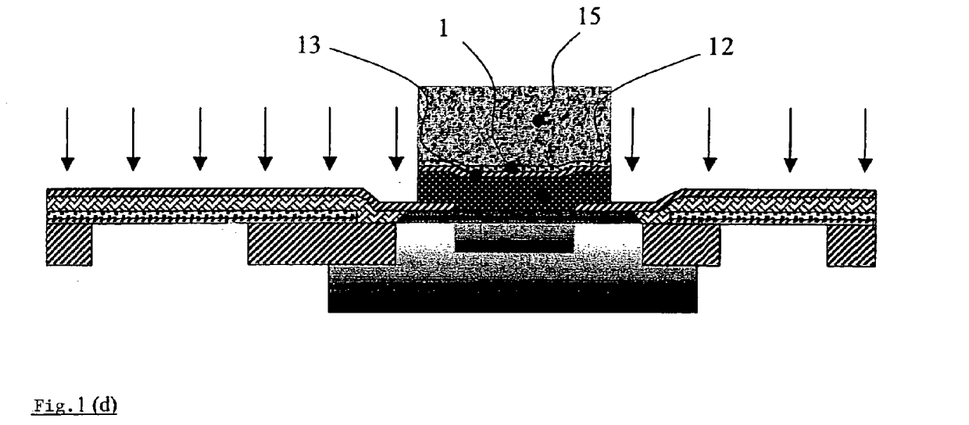
FIG. 1(d) is a diagram of a semiconductor structure in accordance with a respective step in the process of the present invention.

FIG. 1(d) shows the structuring of the layers 9 and 12 and the auxiliary layers 13 consisting of $SiO_2$ and 14, preferably comprising Si-rich silicon nitride, which is effected by means of a photolacquer mask 15 and dry-chemical etching at a defined distance in relation to the emitter window. After the etching operation, the mask 12 also serves for the local introduction of a B- or $BF_2$-implant for doping of the outer base regions of the HBTs.

Figure 1E:
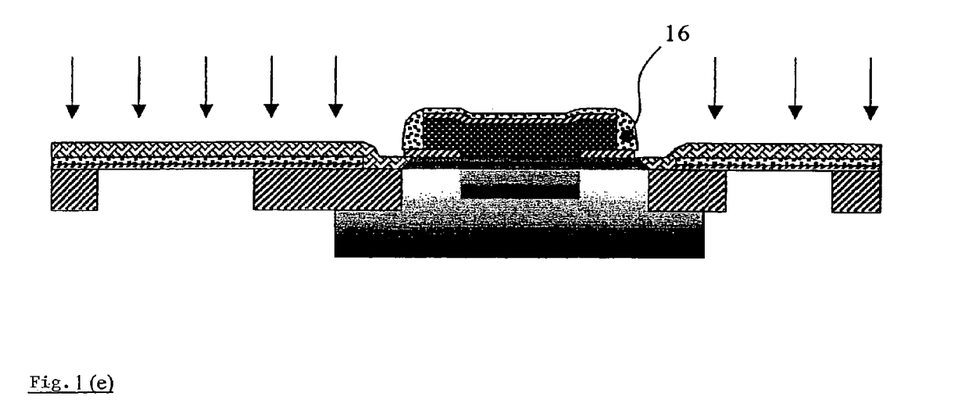
FIG. 1(e) is a diagram of a semiconductor structure in accordance with a respective step in the process of the present invention.

After removal of the lacquer mask, an $Si_3N_4$-layer is deposited and removed again without using a lacquer mask by means of an etching step having a strongly anisotropic action, wherein formed at the previously produced edges of the layer stack 9, 12, 13 and 14 is an $Si_3N_4$-spacer 16 (FIG. 1(e)) which rounds those edges. That rounding is intended to prevent the formation of spacers at those edges in the subsequent operation of structuring the CMOS-gates. After the formation of the $Si_3N_4$-spacers 16, the layer 8 is removed by means of hydrofluoric acid-bearing solution and implantation with B- or $BF_2$-ions is again optionally implemented, which serves to further increase the doping level of the outer base regions of the HBTs.

Figure 1F:
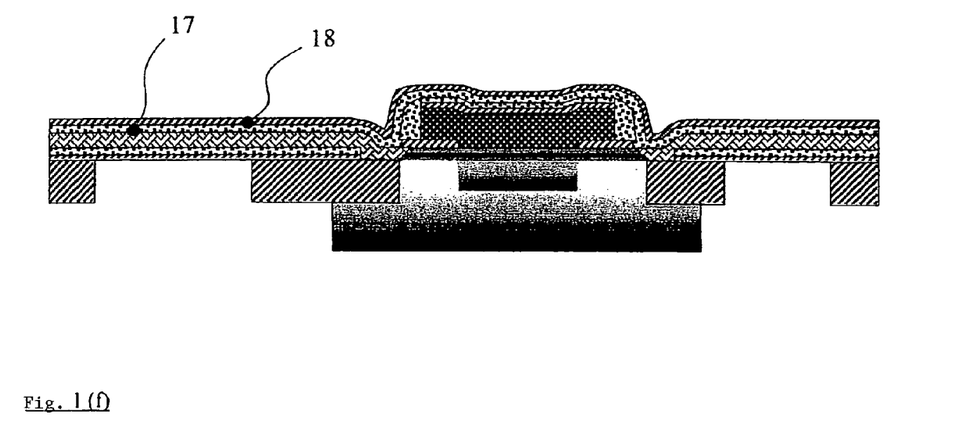
FIG. 1(f) is a diagram of a semiconductor structure in accordance with a respective step in the process of the present invention.
Figure 1G:
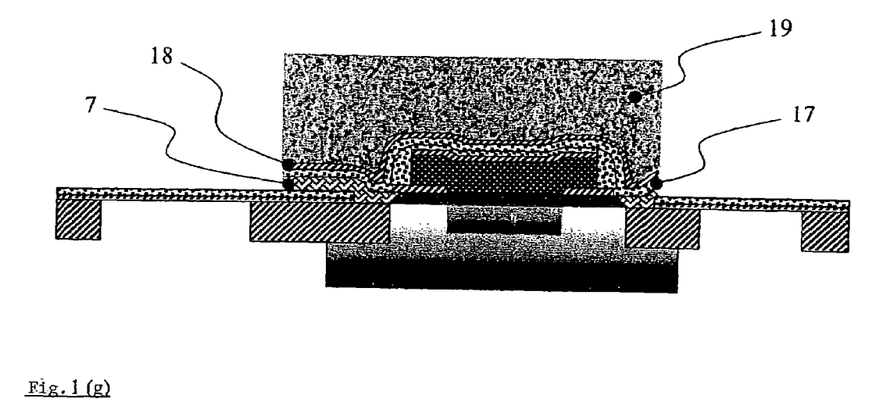
FIG. 1(g) is a diagram of a semiconductor structure in accordance with a respective step in the process of the present invention.

The procedure then involves depositing on the resulting structure an $Si_3N_4$-layer 17 and an $SiO_2$-layer 18 (FIG. 1(f)).

The following lacquer mask 19 defines the outside edge of the outer base regions of the HBTs. With that lacquer mask, the layers 18, 17 and 7 are removed preferably by means of dry-chemical etching from all regions in which the CMOS-transistors are later produced (FIG. 1(g)).

Figure 1H:
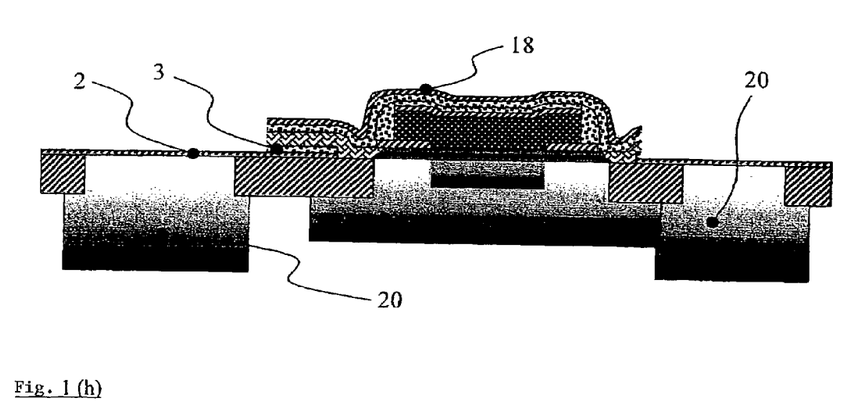
FIG. 1(h) is a diagram of a semiconductor structure in accordance with a respective step in the process of the present invention.

After removal of the lacquer mask 19 the $Si_3N_4$-layer 3 is then preferably removed by means of phosphoric acid, in which respect there is no etching attack on the subjacent $SiO_2$-layer 2 by virtue of the selectivity, which is known to be high, of the etching rates (FIG. 1(h)). It is at that stage of the BiCMOS-process that production of the CMOS-transistors begins. Production of the n- and p-wells for the MOS-transistors with a p- or n-channel respectively is firstly implemented by using various lacquer masks, implantation and restoring steps.

FIG. 1(h) shows by way of example the produced n-well 20 of an MOS-transistor with a p-channel. FIG. 1(h) also shows that a suitable lacquer mask configuration makes it possible to introduce the n-wells, in overlapping relationship with the n-conducting region 5, into the regions on which contacting of the HBT-collectors later occurs. It is possible in that way to provide that no more than 4 lithographic steps (lacquer masks 4, 10, 15 and 19) are required for producing the HBT-structure.

Figure 1I:
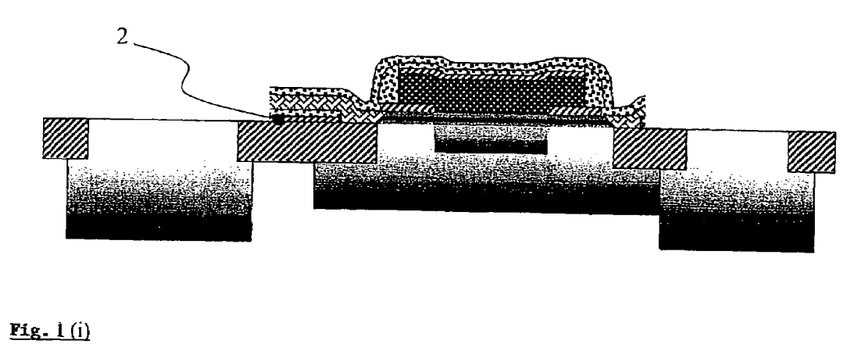
FIG. 1(i) is a diagram of a semiconductor structure in accordance with a respective step in the process of the present invention.

Subsequently the $SiO_2$-layer 2 is removed over the well regions of the CMOS-transistors and at the same time the $SiO_2$-layer 18 over the HBT-structures, by means of hydrofluoric acid-bearing solution (FIG. 1(i)).

Figure 1J:
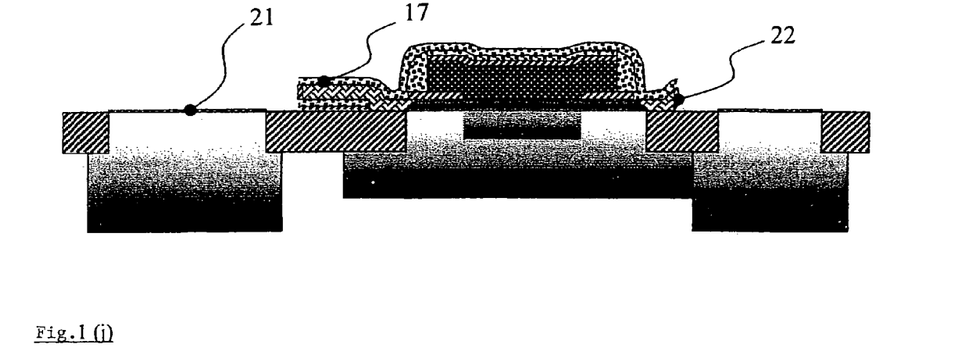
FIG. 1(j) is a diagram of a semiconductor structure in accordance with a respective step in the process of the present invention.

After implementation of one of the usual cleaning procedures the gate oxidation operation is then effected, in which case the thin $SiO_2$-layer 21 is produced over the well regions of the CMOS-transistors and an oxide layer 22 is produced at the exposed edges of the polycrystalline SiGe/Si-layer 7 (FIG. 1(j)). It is essential for production in accordance with the invention of the SiGe-HBTs that the covering of the HBT-structures with the $Si_3N_4$-layer 17 prevents conversion of silicon to silicon oxide within those structures.

Figure 1K:
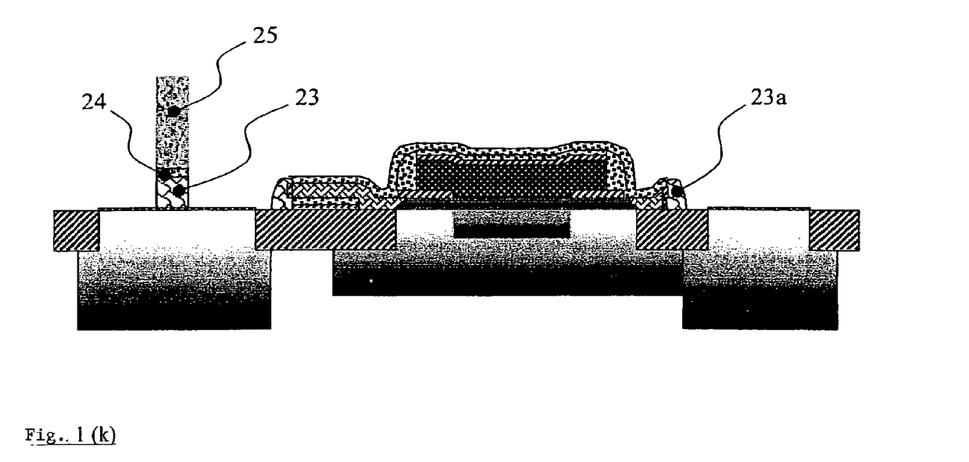
FIG. 1(k) is a diagram of a semiconductor structure in accordance with a respective step in the process of the present invention.

FIG. 1(k) illustrates the production of the gates of the CMOS-transistors, comprising a preferably amorphous Si-layer 23, using an Si-rich nitride layer 24 and a lacquer mask 25. In the operation of dry etching the layers 24 and 23, spacers 23a are formed at the outer edges of the HBT-structure, such spacers having no negative influence at all on the function or parameters of the HBTs.

Unwanted spacer formation at the inner relief of the HBT-structure is prevented by the rounding of the relief, as described with reference to FIG. 1(e). After removal of the lacquer mask 25 reoxidation of the gates is effected, in which case an oxide layer 26 is formed at the side walls thereof (FIG. 1(l)).

Figure 1L:
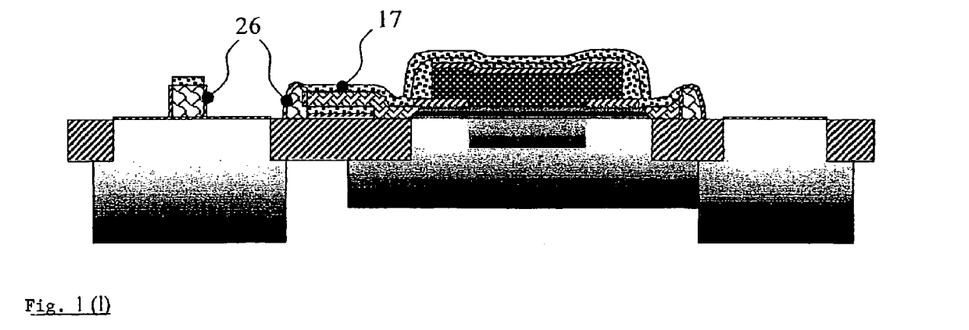
FIG. 1(l) is a diagram of a semiconductor structure in accordance with a respective step in the process of the present invention.

As in the case of gate oxidation the $Si_3N_4$-layer 17 again prevents conversion of silicon into silicon oxide within the HBT-structures. The production of so-called LDD-regions or the involvement of so-called pocket implantation operations, as are usually employed in modern CMOS-technologies, are not illustrated here. The technological steps required for same can also be introduced without any problems into the BiCMOS-process described herein.

Figure 1M:
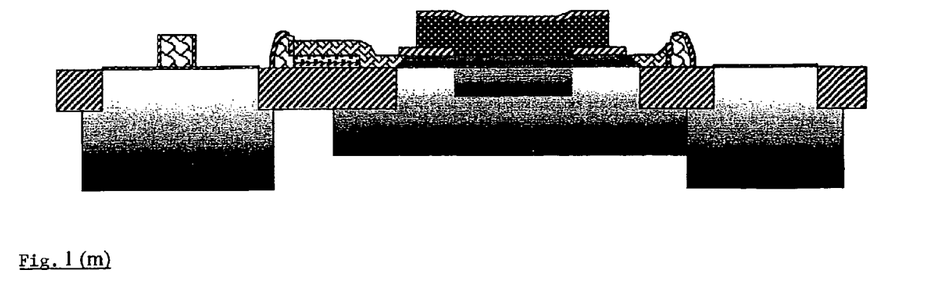
FIG. 1(m) is a diagram of a semiconductor structure in accordance with a respective step in the process of the present invention.

The nitride layer 24 is now removed over the CMOS-gates and the nitride layer 17 is removed over the HBT-structures, by a subsequent etching step in phosphoric acid (FIG. 1(m)).

Figure 1N:
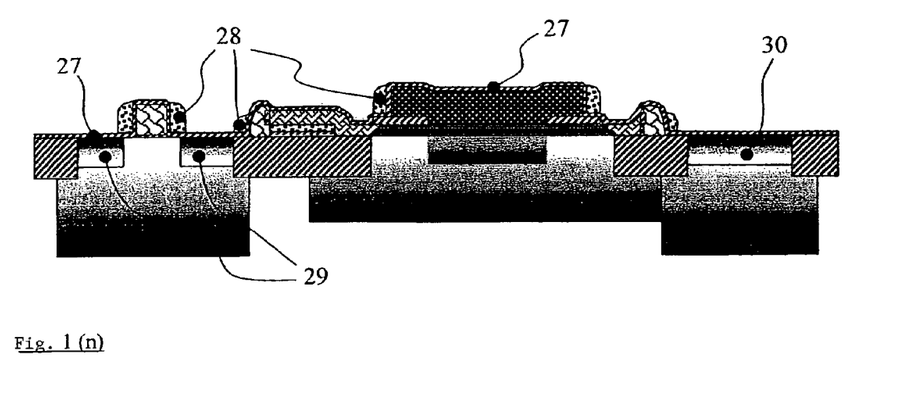
FIG. 1(n) is a diagram of a semiconductor structure in accordance with a respective step in the process of the present invention.
Figure 1O:
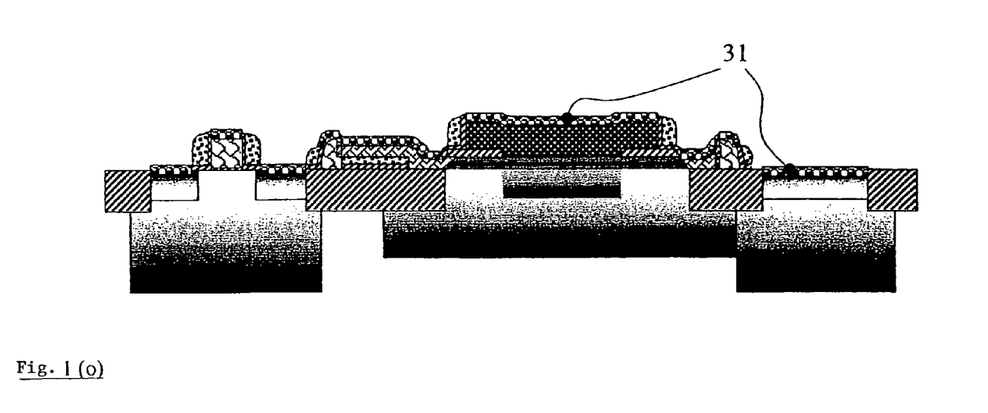
FIG. 1(o) is a diagram of a semiconductor structure in accordance with a respective step in the process of the present invention.

FIG. 1(n) illustrates the subsequent production of gate nitride spacers 28 on an oxide substrate 27 and (shown by reference to the example of the MOS-transistor with a p-channel), production of the highly doped source and drain regions 29 of the CMOS-transistors. A suitable configuration for the lacquer mask for implantation of the source and drain regions of the MOS-transistors with an n-channel means that the implantation operation can also be used to produce highly doped, n-conducting regions 30 in the contact region of the HBT-collectors. After removal of the lacquer masks (not shown) for the source/drain implantation operations and restoring steps which are usually implemented by means of RTA, the oxide layer 27 is then removed by means of hydrofluoric acid-bearing solution. Subsequently thereto, a contact silicide layer 31 is formed on all Si-regions not covered by an insulating layer, using the methods which are usual in semiconductor technology (FIG. 1(o)), and provides for contacting, wiring and passivation of the transistors.

Figure 1P:
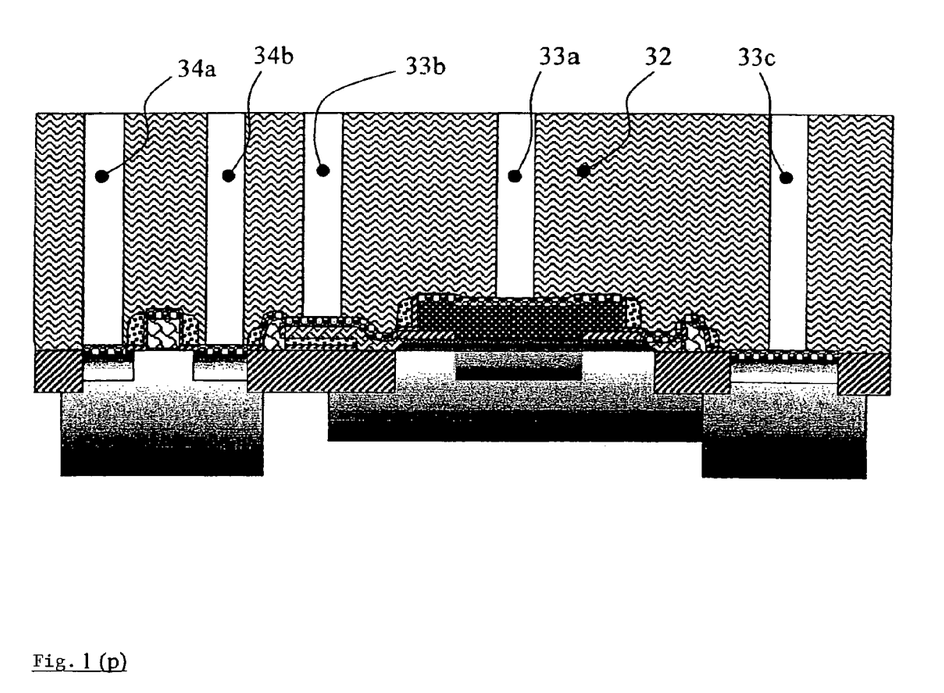
FIG. 1(p) is a diagram of a semiconductor structure in accordance with a respective step in the process of the present invention.

FIG. 1(p) also illustrates production of the contact holes in the insulating layer 32 for an HBT-emitter 33a, the HBT-base 33b and the HBT-collector 33c, as well as for a source 34a and the drain 34b of the CMOS-transistors.

In the present description the process according to the invention for the production of high-speed vertical npn-bipolar transistors and complementary MOS-transistors on a chip was set forth with reference to a specific embodiment. It should be noted however that the present invention is not limited to the details of the description in the specific embodiment as alterations and modifications are claimed within the scope of the claims.

The invention claimed is:

1. A process for the production of high-speed vertical npn-bipolar transistors and complementary MOS-transistors on a chip with implementation of all technological process steps for the production of a vertical structure of a collector, base and emitter in an active region of the npn-bipolar transistors and for lateral structuring of the collector, base and emitter regions prior to production of the wells or the gate insulating layer for the MOS-transistors, wherein finished structures of the npn-bipolar transistors are provided prior to production of the gate insulating layer for the MOS-transistors with a protective layer which during implementation of the technological process steps for production of the MOS-transistors prevents the conversion of silicon into silicon oxide within the finished structures of the npn-bipolar transistors.

2. A process as set forth in claim 1, wherein the implementation of the technological process steps for the production of the vertical structure of the collector, base and emitter in the active region of the npn-bipolar transistors and for lateral structuring of the collector, base and emitter regions are prior to production of the wells and the gate insulating layer for the MOS-transistors.

3. A process as set forth in claim 1 wherein the npn-bipolar transistors are produced with a product of collector-emitter breakdown voltage ($BV_{CEO}$) and transit frequency ($F_T$) of at least 150 VGHz.

4. A process as set forth in claim 1 wherein a relief between a structured emitter and base regions of the npn-bipolar transistors is rounded prior to production of the gate insulating layer for the MOS-transistors to such an extent as to avoid the formation of spacers at said relief during structuring of the gates of the MOS-transistors.

5. A process as set forth in claim 1 wherein not more than 4 lithographic steps are employed for producing the vertical structure of the collector, base and emitter in the active region of the npn-bipolar transistors and lateral structuring of the collector, base and emitter regions.

6. A process as set forth in claim 1 wherein a doping profile for the base of the bipolar structures in a vertical direction is enclosed by a C-atom profile which has a concentration in a range of between $1 \times 10^{19}$ and $1 \times 10^{20}$ cm$^{-3}$.

7. A process for the production of high-speed vertical npn-bipolar transistors and complementary MOS-transistors on a chip with implementation of all technological process steps for the production of a vertical structure of a collector, base and emitter in an active region of the npn-bipolar transistors and for lateral structuring of the collector, base and emitter regions prior to production of the wells or the gate insulating layer for the MOS-transistors, wherein a relief between a structured emitter and base regions of the npn-bipolar transistors is rounded prior to production of the gate insulating layer for the MOS-transistors to such an extent as to avoid the formation of spacers at said relief during structuring of the gates of the MOS-transistors.

8. A process as set forth in claim 7, wherein the implementation of the technological process steps for the production of the vertical structure of the collector, base and emitter in the active region of the npn-bipolar transistors and for lateral structuring of the collector, base and emitter regions are prior to production of the wells and the gate insulating layer for the MOS-transistors.

9. A process as set forth in claim 7, wherein the npn-bipolar transistors are produced with a product of collector-emitter breakdown voltage (BV$_{CEO}$) and transit frequency (F$_T$) of at least 150 VGHz.

10. A process as set forth in claim 7, wherein finished structures of the npn-bipolar transistors are provided prior to production of the gate insulating layer for the MOS-transistors with a protective layer which during implementation of technological process steps for production of the MOS-transistors prevents the conversion of silicon into silicon oxide within the finished structures of the npn-bipolar transistors.

11. A process as set forth in claim 7, wherein not more than 4 lithographic steps are employed for producing the vertical structure of the collector, base and emitter in the active region of the npn-bipolar transistors and lateral structuring of the collector, base and emitter regions.

12. A process as set forth in claim 7, wherein a doping profile for the base of the bipolar structures in a vertical direction is enclosed by a C-atom profile which has a concentration in a range of between $1 \times 10^{19}$ and $1 \times 10^{20}$ cm$^{-3}$.

* * * * *

UNITED STATES PATENT AND TRADEMARK OFFICE
CERTIFICATE OF CORRECTION

| | |
|---|---|
| PATENT NO. | : 7,205,188 B2 |
| APPLICATION NO. | : 10/450006 |
| DATED | : April 17, 2007 |
| INVENTOR(S) | : Knoll et al. |

Page 1 of 1

It is certified that error appears in the above-identified patent and that said Letters Patent is hereby corrected as shown below:

In column 1, line 7, after "Background of the Invention" -- This application is a 371 of PCT/EP01/14319 filed 12/26/2001 -- should be inserted.

Signed and Sealed this

Twelfth Day of August, 2008

JON W. DUDAS
*Director of the United States Patent and Trademark Office*